United States Patent
Fukumoto et al.

(10) Patent No.: US 9,478,416 B1
(45) Date of Patent: Oct. 25, 2016

(54) SEMICONDUCTOR MANUFACTURING APPARATUS AND METHOD OF MANUFACTURING SEMICONDUCTOR DEVICE

(71) Applicant: KABUSHIKI KAISHA TOSHIBA, Minato-ku (JP)

(72) Inventors: Atsushi Fukumoto, Yokkaichi (JP); Fumiki Aiso, Kuwana (JP); Takeshi Shundo, Nagoya (JP); Hajime Nagano, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/019,271

(22) Filed: Feb. 9, 2016

(30) Foreign Application Priority Data

Aug. 20, 2015 (JP) ................ 2015-162663

(51) Int. Cl.
| | |
|---|---|
| *H01L 21/58* | (2006.01) |
| *H01L 21/67* | (2006.01) |
| *H01L 21/02* | (2006.01) |
| *H01L 21/677* | (2006.01) |
| *C23C 16/455* | (2006.01) |
| *C23C 16/458* | (2006.01) |

(52) U.S. Cl.
CPC ....... *H01L 21/0228* (2013.01); *C23C 16/4586* (2013.01); *C23C 16/45544* (2013.01); *H01L 21/0262* (2013.01); *H01L 21/67098* (2013.01); *H01L 21/67793* (2013.01)

(58) Field of Classification Search
CPC .......... H01L 21/6835; H01L 27/1266; H01L 31/1892; H01L 33/0005
USPC ............................................. 438/26, 62, 118
See application file for complete search history.

(56) References Cited

U.S. PATENT DOCUMENTS

| | | |
|---|---|---|
| 6,840,732 B2 | 1/2005 | Minami et al. |
| 8,889,438 B2* | 11/2014 | Eguchi ............... H01L 21/6835 438/118 |
| 9,087,931 B2* | 7/2015 | Eguchi ............... H01L 21/6835 |
| 9,397,126 B2* | 7/2016 | Eguchi ............... H01L 27/1266 |
| 2013/0192761 A1 | 8/2013 | Yudovsky et al. |

FOREIGN PATENT DOCUMENTS

| | | |
|---|---|---|
| JP | 4489999 | 6/2010 |
| JP | 2015-507097 | 3/2015 |

* cited by examiner

*Primary Examiner* — Cuong Q Nguyen
(74) *Attorney, Agent, or Firm* — Oblon, McClelland, Maier & Neustadt, L.L.P

(57) ABSTRACT

In one embodiment, a semiconductor manufacturing apparatus includes a belt supporting module including a first portion that is provided around a first axis, a second portion that is provided around a second axis different from the first axis, a third portion connecting the first and second portions, and a fourth portion connecting the first and second portions and positioned below the third portion. The apparatus further includes a belt provided on the belt supporting module, and configured to rotate around the first axis in a first direction and rotate around the second axis in a second direction reverse to the first direction. The apparatus further includes a wafer supporting module provided on the belt and configured to support a wafer. The apparatus further includes raw material feeding heads provided above the belt and configured to feed a raw material of a film to be formed on the wafer.

20 Claims, 8 Drawing Sheets

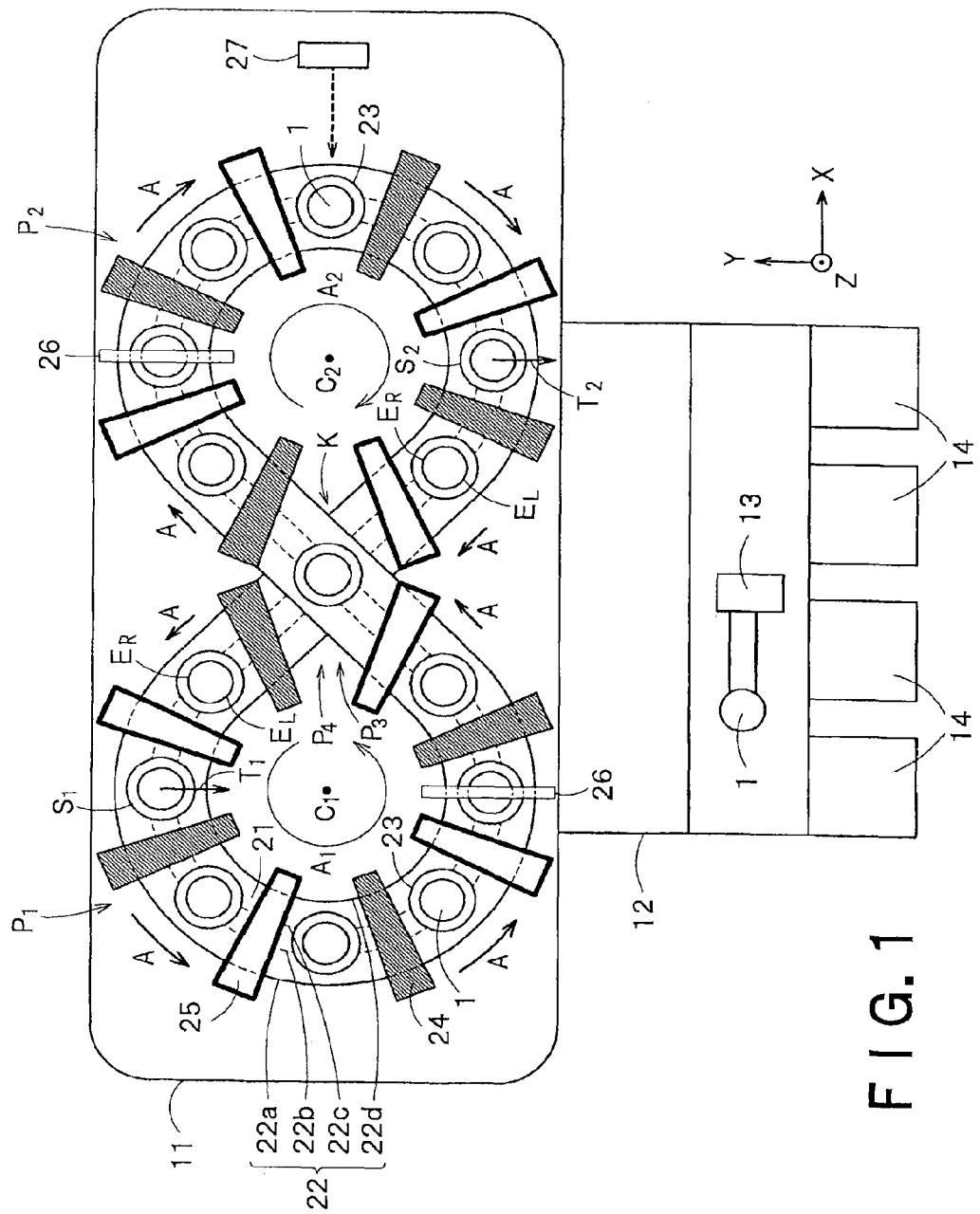
F I G. 1

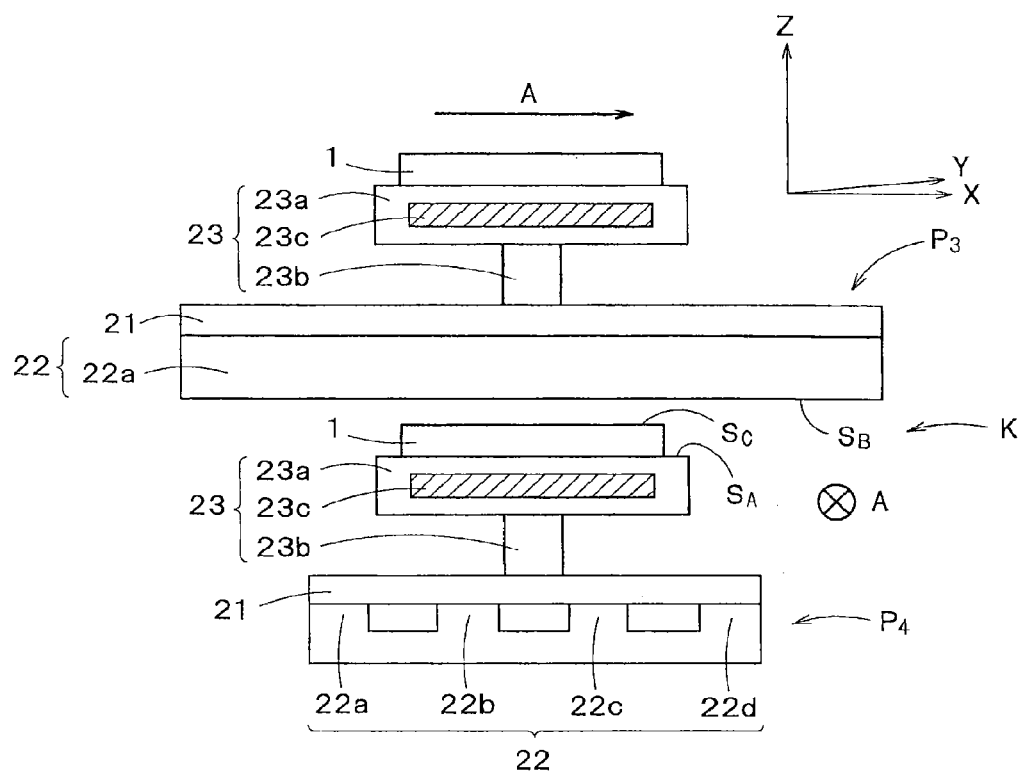
F I G. 3

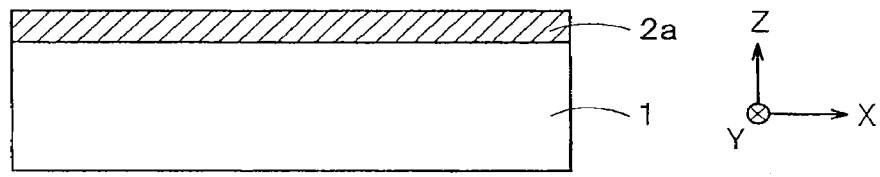
F I G. 5A
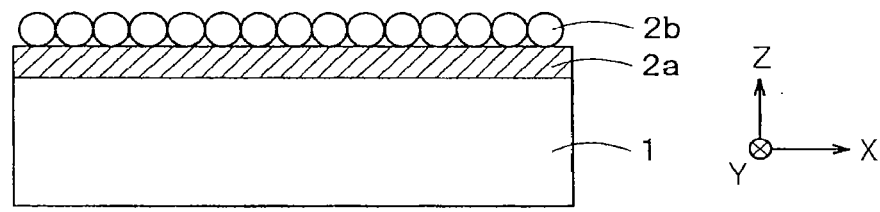
F I G. 5B
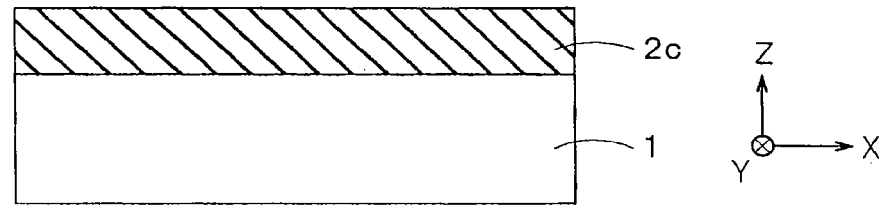
F I G. 5C
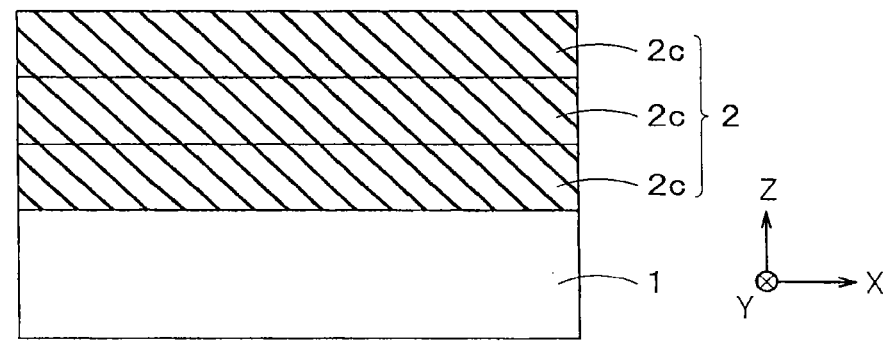
F I G. 5D

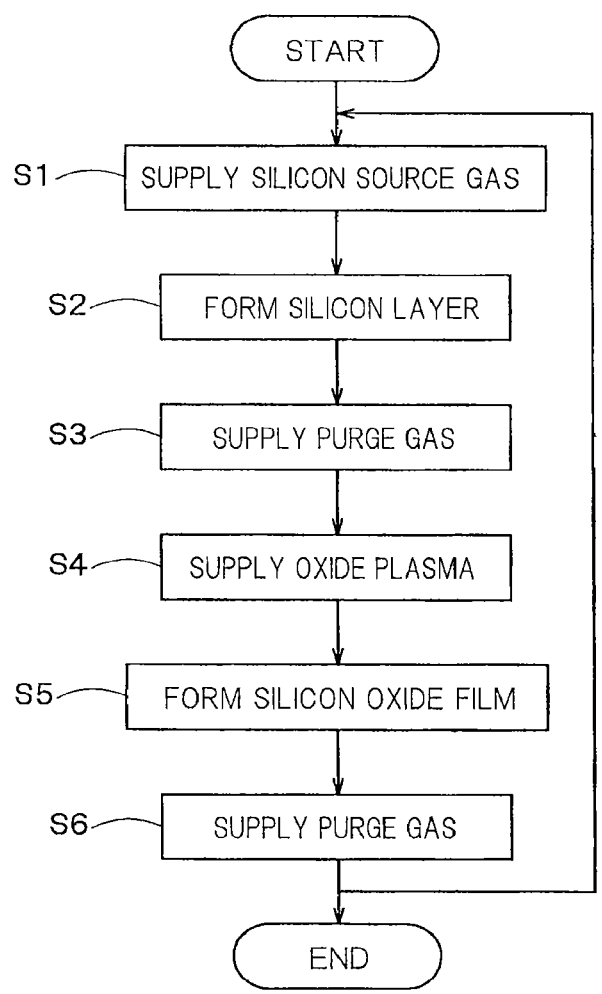
F I G. 6

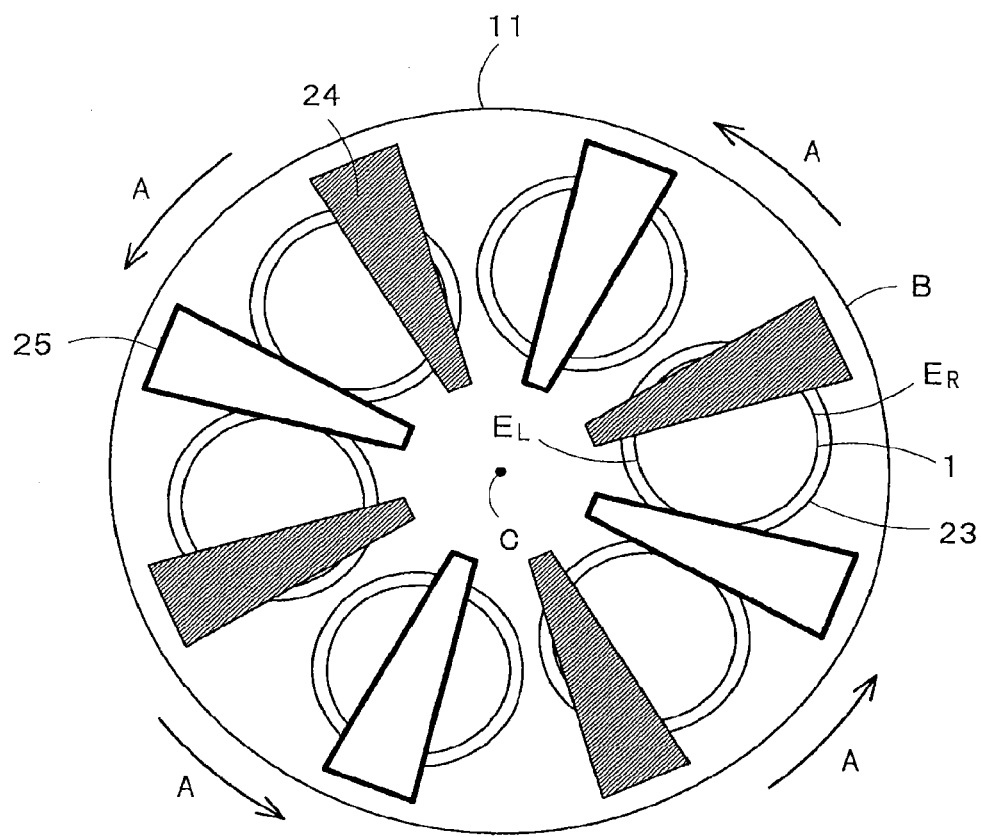
F I G. 7

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2015-162663, filed on Aug. 20, 2015, the entire contents of which are incorporated herein by reference.

FIELD

Embodiments described herein relate to a semiconductor manufacturing apparatus and a method of manufacturing a semiconductor device.

BACKGROUND

For example, an atomic layer deposition (ALD) apparatus forms films on wafers while it rotates the wafers along a circular trajectory in a chamber. In this case, thicknesses and qualities of the films suffer variation between inner circumferences of the wafers and outer circumferences of the wafers, wherein the inner circumferences of the wafers are positioned on the center side of the chamber and the outer circumferences of the wafers are positioned on the periphery side of the chamber. The reason is that deposition characteristics of the ALD apparatus are different in the center portion and the periphery portion of the chamber. Therefore, there is a problem that the films that are uniform in thickness and quality cannot be formed on the wafers.

BRIEF DESCRIPTION OF THE DRAWINGS

FIG. 1 is a top view illustrating a structure of a semiconductor manufacturing apparatus of a first embodiment;

FIG. 3 is a cross-sectional view illustrating the structure of the semiconductor manufacturing apparatus of the first embodiment;

FIGS. 5A to 5D are cross-sectional views illustrating a method of manufacturing a semiconductor device of the first embodiment;

FIG. 6 is a flowchart illustrating the method of manufacturing the semiconductor device of the first embodiment;

FIG. 7 is a top view illustrating a structure of a semiconductor manufacturing apparatus in a comparative example of the first embodiment.

DETAILED DESCRIPTION

Figure 2:
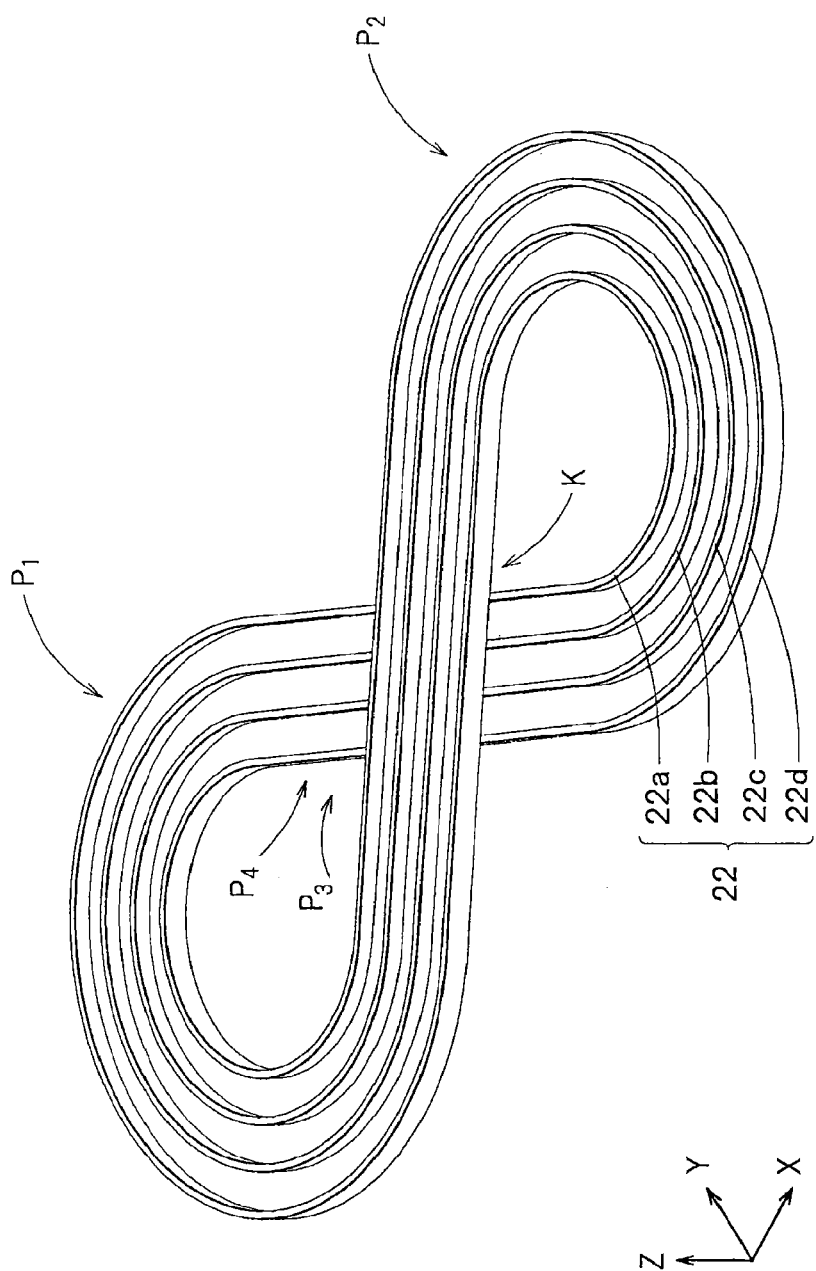
FIG. 2 is a perspective view illustrating a structure of a belt supporting module of the first embodiment.

Embodiments will now be explained with reference to the accompanying drawings.

In one embodiment, a semiconductor manufacturing apparatus includes a belt supporting module including a first portion that is provided around a first axis, a second portion that is provided around a second axis different from the first axis, a third portion that connects the first portion and the second portion, and a fourth portion that connects the first portion and the second portion and is positioned below the third portion. The apparatus further includes a belt provided on the belt supporting module, configured to rotate around the first axis in a first direction, and configured to rotate around the second axis in a second direction that is reverse to the first direction. The apparatus further includes a wafer supporting module provided on the belt and configured to support a wafer. The apparatus further includes raw material feeding heads provided above the belt and configured to feed a raw material of a film to be formed on the wafer.

First Embodiment

FIG. 1 is a top view illustrating a structure of a semiconductor manufacturing apparatus of a first embodiment.

The semiconductor manufacturing apparatus in FIG. 1 includes a chamber 11, an interface room 12, an arm 13 and front opening unified pod (FOUP) stages 14.

The chamber 11 can contain a plurality of wafers 1. The semiconductor manufacturing apparatus in FIG. 1 is an ALD apparatus and forms films on the wafers 1 in the chamber 11 by ALD. The interface room 12 separates an atmosphere (vacuum) in the chamber 11 from the open air.

An arm 13 takes out the wafers 1 from the FOUPs on the FOUP stages 14 and carries the wafers 1 into the chamber 11 via the interface room 12. Moreover, the arm 13 takes out the wafers 1 in the chamber 11 therefrom via the interface room 12 and causes the wafers 1 to be contained in the FOUPs on the FOUP stages 14. The FOUP stages 14 are used for placing the plurality of FOUPs thereon.

FIG. 1 illustrates an X-direction and a Y-direction that are substantially parallel to the horizontal plane and perpendicular to each other, and a Z-direction that is substantially perpendicular to the horizontal plane. In the present specification, the +Z-direction is regarded as the upward direction and the −Z-direction is regarded as the downward direction. The −Z-direction of the present embodiment may completely coincide with the direction of gravity or may not completely coincide with the direction of gravity.

The chamber 11 of the present embodiment includes a belt 21, a belt supporting module 22, wafer supporting modules 23, first raw material feeding heads 24, second raw material feeding heads 25, purge gas heads 26 and a motor 27. The first and second raw material feeding heads 24 and 25 are an example of raw material feeding heads of the disclosure.

The belt supporting module 22 is a guide supporting the belt 21. The belt supporting module 22 includes first to fourth portions $P_1$ to $P_4$. The first portion $P_1$ is provided around an axis $C_1$ parallel to the Z-axis. The axis $C_1$ is an example of a first axis. The second portion $P_2$ is provided around an axis $C_2$ parallel to the Z-axis. The axis $C_2$ is an example of a second axis different from the first axis. The third portion $P_3$ connects the first portion $P_1$ and the second portion $P_2$. The fourth portion $P_4$ connects the first portion $P_1$ and the second portion $P_2$ and is positioned below the third portion $P_3$. The third portion $P_3$ and the fourth portion $P_4$ form a grade separated crossing at the position designated by the arrow K. The belt supporting module 22 has an 8-shape surrounding the axis $C_1$ and the axis $C_2$.

The belt 21 is provided on the belt supporting module 22. The belt 21 has an 8-shape similarly to the belt supporting module 21 and rotates along the belt supporting module 22 as indicated by the arrows A. Therefore, the belt 21 rotates around the axis $C_1$ counterclockwise as indicated by the arrow $A_1$ and rotates around the axis $C_2$ clockwise as indicated by the arrow $A_2$. The counterclockwise direction is an example of a first direction. The clockwise direction is an example of a second direction that is reverse to the first direction. The belt 21 is driven by the motor 27 to rotate.

The arrows A indicate the movement direction of the belt 21. The belt supporting module 22 includes a plurality of rails 22a to 22d extending along the movement direction of the belt 21. The belt 21 is provided on these rails 22a to 22d. Details of the belt supporting module 22 are illustrated in FIG. 2. FIG. 2 is a perspective view illustrating a structure of the belt supporting module 22 of the first embodiment. As illustrated in FIG. 2, the rails 22a to 22d form a grade separated crossing at the position designated by the arrow K.

Description of the semiconductor manufacturing apparatus of the present embodiment will be continued again with reference to FIG. 1.

The wafer supporting modules 23 are provided on the belt 21. Therefore, the wafer supporting modules 23 rotate along with the belt 21 as indicated by the arrows A. The wafer supporting modules 23 are used for supporting the wafers 1. In FIG. 1, each wafer supporting module 23 supports one wafer 1. The wafers 1 of the present embodiment rotate with the belt 21 in a manner of a belt conveyor.

Sign $S_1$ denotes an upper face of a wafer supporting module 23 that moves on the first portion $P_1$. Sign $S_2$ denotes an upper face of a wafer supporting module 23 that moves on the second portion $P_2$. In the present embodiment, the upper face $S_1$ of the wafer supporting module 23 that moves on the first portion $P_1$ inclines relative to the XY-plane so as to descend in a $T_1$ direction toward the axis $C_1$. Meanwhile, the upper face $S_2$ of the wafer supporting module 23 that moves on the second portion $P_2$ inclines relative to the XY-plane so as to climb in a $T_2$ direction separate from the axis $C_2$. The reason is that the wafer supporting modules 23 are fixed onto the belt 21 such that an upper face of a wafer supporting module 23 that moves on the fourth portion $P_4$ is parallel to the XY-plane. A reason why such a manner of fixing is adopted is mentioned later.

The number of the wafer supporting modules 23 provided on the belt 21 may be arbitrary. For example, the number of the wafer supporting modules 23 provided on the belt 21 may be a multiple of 25 since the number of the wafers 1 that can be contained in one FOUP is typically 25.

The first and second raw material feeding heads 24 and 25 are shower heads that feed raw materials of the films to be formed on the wafers 1. The first and second raw material feeding heads 24 and 25 are alternately provided along the movement direction of the belt 21 above the belt 21. The films are, for example, silicon oxide films. The silicon oxide films are an example of a compound containing a first element and a second element.

The first raw material feeding heads 24 feed a first raw material of the films to be formed on the wafers 1. The first raw material of the present embodiment is a silicon source gas containing silicon. Silicon is an example of the first element. In the present embodiment, a silicon layer is formed on each wafer 1 with the first raw material.

The second raw material feeding heads 25 feed a second raw material of the films to be formed on the wafer 1. The second raw material of the present embodiment is oxygen plasma. Oxygen is an example of the second element. In the present embodiment, the silicon layer is oxidized by the second raw material and the silicon layer is changed into a silicon oxide film.

The film formed on each wafer 1 may be other than the silicon oxide film. Examples of such a film include an aluminum oxide film, an aluminum nitride film, a titanium oxide film, a titanium nitride film and a silicon nitride film. When the film formed on the wafer 1 is a silicon nitride film, an example of the first raw material is a silicon source gas and an example of the second raw material is nitrogen plasma. In this case, the silicon layer is nitrided by the second raw material and the silicon layer is changed into the silicon nitride film. When a certain film is to be formed from the silicon layer on each wafer 1, the silicon layer may be changed into this film by chemical change other than oxidation and nitrization.

The purge gas heads 26 are shower heads that feed a purge gas. An example of the purge gas is an inert gas such as a nitrogen gas and a rare gas. The purge gas heads 26 are provided above the belt 21 between the first raw material feeding heads 24 and the second raw material feeding heads 25. The purge gas is used for discharging the silicon source gas (first raw material) and the oxygen plasma (second raw material).

The purge gas heads 26 of the present embodiment are provided at all of the gaps between the first raw material feeding heads 24 and the second raw material feeding heads 25. It should be noted that in FIG. 1, only two purge gas heads 26 provided at two gaps are illustrated for convenience of drawing these. Namely, in the present embodiment, these heads 24, 25 and 26 are arranged repeatedly in the order of the head 24, the head 26, the head 25 and the head 26.

Next, signs $E_R$ and $E_L$ are described.

The signs $E_R$ and $E_L$ respectively denote a right end and a left end of each wafer 1 relative to the movement direction of the belt 21. When each wafer 1 moves on the first portion $P_1$, the right end $E_R$ becomes the outer circumference of the wafer 1 relative to the axis $C_1$, and the left end $E_L$ becomes the inner circumference of the wafer 1 relative to the axis $C_1$. On the other hand, when each wafer 1 moves on the second portion $P_2$, the right end $E_R$ becomes the inner circumference of the wafer 1 relative to the axis $C_2$, and the left end $E_L$ becomes the outer circumference of the wafer 1 relative to the axis $C_2$.

As described above, the inner circumference and the outer circumference of each wafer 1 can be interchanged between the first portion $P_1$ and the second portion $P_2$ in the present embodiment. Therefore, according to the present embodiment, the films that are uniform in thickness and quality can be formed on the wafers 1. Moreover, according to the present embodiment, since such interchange can be realized only by conveying the wafers 1 on the belt 21, the films high in uniformity can be formed without deterioration of productivity of semiconductor devices.

For example, it is supposed that a film that is high in ratio of oxygen relative to silicon and large in thickness is formed on the inner circumference of each wafer 1, and that a film that is low in ratio of oxygen relative to silicon and small in thickness is formed on the outer circumference of each wafer 1. In this case, when each wafer 1 moves on the first portion $P_1$, the film that is low in ratio of oxygen relative to silicon and small in thickness is formed at the right end $E_R$. On the other hand, when each wafer 1 moves on the second portion $P_2$, the film that is high in ratio of oxygen relative to silicon and large in thickness is formed at the right end $E_R$. The reverse relation thereto is satisfied at the left end $E_L$. As a result, a film uniform in quality (silicon ratio) and thickness is formed on each wafer 1.

FIG. 3 is a cross-sectional view illustrating the structure of the semiconductor manufacturing apparatus of the first embodiment.

FIG. 3 illustrates cross sections of the belt 21, the belt supporting module 22 and the wafer supporting modules 23 at the position of the grade separated crossing, designated by the arrow K.

Each wafer supporting module 23 includes a stage 23a, a shaft 23b and a heater 23c. The stage 23a is used for placing a wafer 1 thereon. The shaft 23b is fixed to the stage 23a and the belt 21. The heater 23c is provided inside the stage 23a and heats the wafer 1 on the stage 23a. The heater 23c of the present embodiment is used for heating the wafer 1 at a temperature at which silicon can be absorbed.

Sign $S_A$ denotes an upper face of a wafer supporting module 23 (upper face of the stage 23a) that moves on the fourth portion $P_4$. Sign $S_B$ denotes a lower face of the third portion $P_3$. Sign $S_c$ denotes an upper face of a wafer 1 that moves on the fourth portion $P_4$.

In the present embodiment, each wafer supporting module 23 is fixed onto the belt 21 such that the upper face $S_A$ of the wafer supporting module 23 that moves on the fourth portion $P_4$ is parallel to the lower face $S_B$ of the third portion $P_3$. The reason is that the upper face $S_c$ of the wafer 1 tends to come into contact with the lower face $S_B$ of the third portion $P_3$ if the upper face $S_A$ of the wafer supporting module 23 inclines relative to the lower face $S_B$ of the third portion $P_3$. According to the present embodiment, while the distance between the upper face $S_A$ of the wafer supporting module 23 and the lower face $S_B$ of the third portion $P_3$ is set short, contact between the wafer 1 and the third portion $P_3$ can be suppressed. In the present embodiment, the lower face $S_B$ of the third portion $P_3$ is set parallel to the XY-plane. Therefore, the upper face $S_A$ of the wafer supporting module 23 that moves on the fourth portion $P_4$ is also parallel to the XY-plane.

Figure 4A:
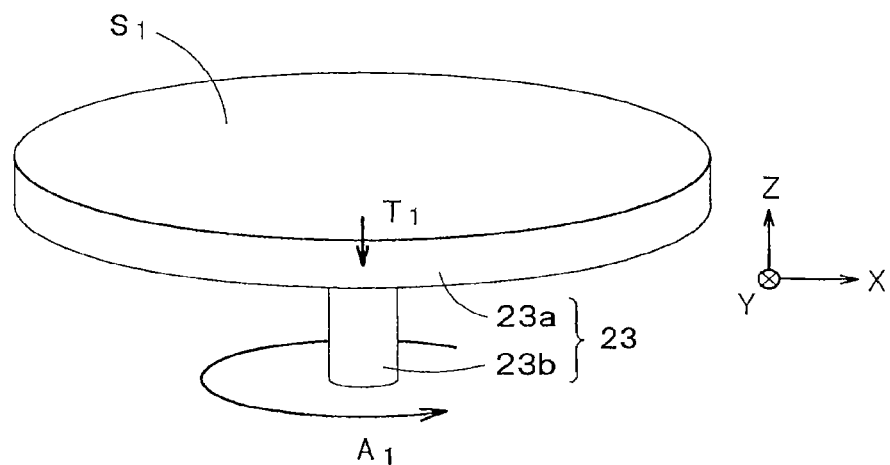
FIGS. 4A and 4B are perspective views illustrating a structure of a wafer supporting module of the first embodiment.
Figure 4B:
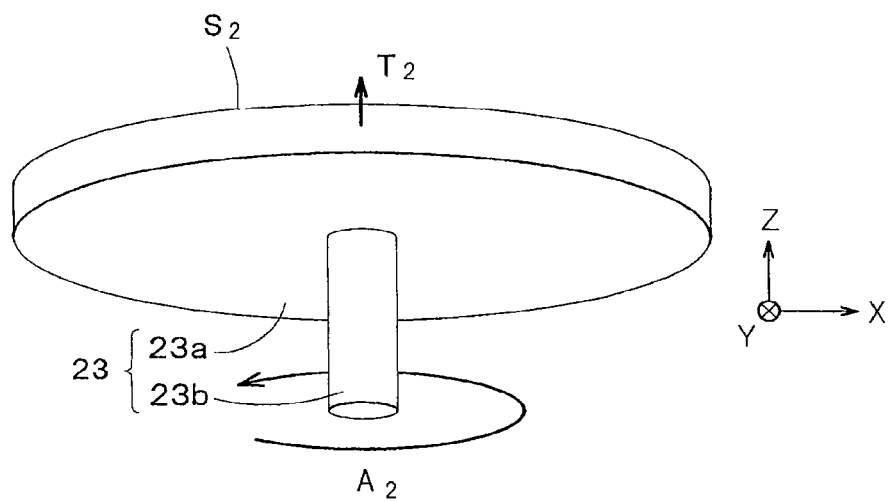

FIGS. 4A and 4B are perspective views illustrating a structure of a wafer supporting module 23 of the first embodiment.

FIG. 4A illustrates a wafer supporting module 23 that moves on the first portion $P_1$. In the present embodiment, each wafer supporting module 23 is fixed onto the belt 21 such that the upper face $S_A$ of the wafer supporting module 23 that moves on the fourth portion $P_4$ is parallel to the lower face $S_B$ of the third portion $P_3$. As a result, the upper face $S_1$ of the wafer supporting module 23 that moves on the first portion $P_1$ inclines relative to the XY-plane so as to descend in the $T_1$ direction toward the axis $C_1$, and inclines relative to the aforementioned upper face $S_A$ and lower face $S_B$. Therefore, when the wafer 1 moves on the first portion $P_1$, the left end $E_L$ is lower than the right end $E_R$ in FIG. 1.

FIG. 4B illustrates a wafer supporting module 23 that moves on the second portion $P_2$. In the present embodiment, each wafer supporting module 23 is fixed onto the belt 21 such that the upper face $S_A$ of the wafer supporting module 23 that moves on the fourth portion $P_4$ is parallel to the lower face $S_B$ of the third portion $P_3$. As a result, the upper face $S_2$ of the wafer supporting module 23 that moves on the second portion $P_2$ inclines relative to the XY-plane so as to climb in the $T_2$ direction separate from the axis $C_2$, and inclines relative to the aforementioned upper face $S_A$ and lower face $S_B$. Therefore, when the wafer 1 moves on the second portion $P_2$, the left end $E_L$ is higher than the right end $E_R$ in FIG. 1.

Inclinations of the upper face $S_1$ in FIG. 4A and the upper face $S_2$ in FIG. 4B are approximately 5 degrees. Therefore, the wafer 1 can be held thereon such that the wafer 1 does not fall off the wafer supporting module 23. It is noted that the upper face of the stage 23a may be formed of a material large in coefficient of friction and a stopper or a chuck may be provided on the stage 23a such that the wafer 1 does not move on the wafer supporting module 23.

FIGS. 5A to 5D are cross-sectional views illustrating a method of manufacturing a semiconductor device of the first embodiment. The method is performed using the semiconductor manufacturing apparatus in FIG. 1.

First, when the wafer 1 moves below one first raw material feeding head 24, the silicon source gas (first raw material) is fed from this first raw material feeding head 24 onto the wafer 1. As a result, a silicon layer 2a is formed on the wafer 1 (FIG. 5A).

Next, when the wafer 1 moves below one second raw material feeding head 25, the oxygen plasma (second raw material) is fed from this second raw material feeding head 25 onto the wafer 1. As a result, oxygen atoms 2b are absorbed on the silicon layer 2a (FIG. 5B).

Furthermore, the silicon layer 2a is oxidized by the oxygen atoms 2b. As a result, the silicon layer 2a is changed into a silicon oxide film 2c (FIG. 5C).

After that, the wafer 1 alternately moves below the first and second raw material feeding heads 24 and 25 by being conveyed with the belt 21. As a result, the silicon oxide films 2c are repeatedly formed on the wafer 1. Therefore, a film 2 composed of the silicon oxide films 2c is formed on a surface of the wafer 1.

When this method is performed, the wafer 1 is heated by the heater 23c of the wafer supporting module 23.

FIG. 6 is a flowchart illustrating the method of manufacturing the semiconductor device of the first embodiment. FIG. 6 illustrates details of the method in FIGS. 5A to 5D.

First, the silicon source gas (first raw material) is fed from one first raw material feeding head 24 onto the wafer 1 (step S1). As a result, the silicon layer 2a is formed on the wafer 1 (step S2).

The wafer 1 then moves below one purge gas head 26. In this stage, the purge gas is fed from this purge gas head 26 onto the wafer 1 (step S3). As a result, the silicon source gas near the wafer 1 is discharged.

Next, the oxygen plasma (second raw material) is fed from one second raw material feeding head 25 onto the wafer 1 (step S4). As a result, the silicon oxide film 2c is formed on the wafer 1 from the silicon layer 2a (step S5).

The wafer 1 then moves below one purge gas head 26. In this stage, the purge gas is fed from this purge gas head 26 onto the wafer 1 (step S6). As a result, the oxygen plasma near the wafer 1 is discharged.

After that, steps S1 to S6 are repeatedly performed and the silicon oxide films 2c are repeatedly formed on the wafer 1. Therefore, the film 2 composed of the silicon oxide films 2c is formed on the front surface of the wafer 1.

FIG. 7 is a top view illustrating a structure of a semiconductor manufacturing apparatus in a comparative example of the first embodiment.

The semiconductor manufacturing apparatus in the comparative example is an ALD apparatus and forms films on the wafers 1 while it rotates the wafers 1 along a circular trajectory in the chamber 11. Sign C denotes the center of the chamber 11. Sign B denotes the periphery of the chamber 11.

In this case, the right end $E_R$ of each wafer always becomes the outer circumference of the wafer 1. The left end $E_L$ of each wafer always becomes the inner circumference of the wafer 1. Therefore, it is difficult to form the films that are uniform in thickness and quality on the wafers 1.

On the other hand, in the present embodiment, the inner circumference and the outer circumference of each wafer 1 can be interchanged between the first portion $P_1$ and the second portion $P_2$. Therefore, the films that are uniform in thickness and quality can be formed on the wafers 1.

Figure 8A:
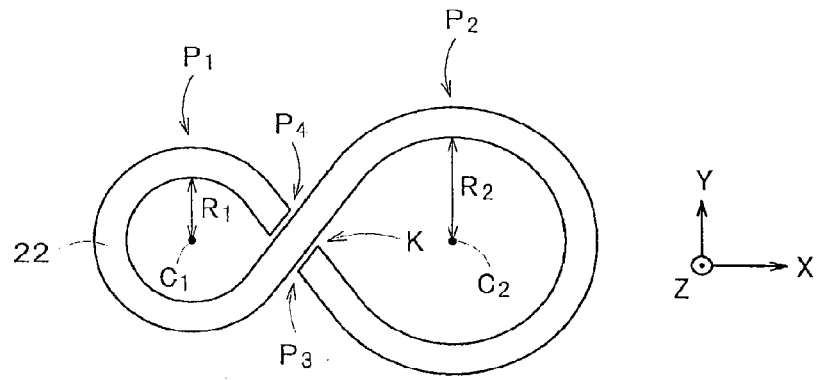
FIGS. 8A to 8C are top views illustrating structures of the belt supporting module of modifications of the first embodiment.
Figure 8B:
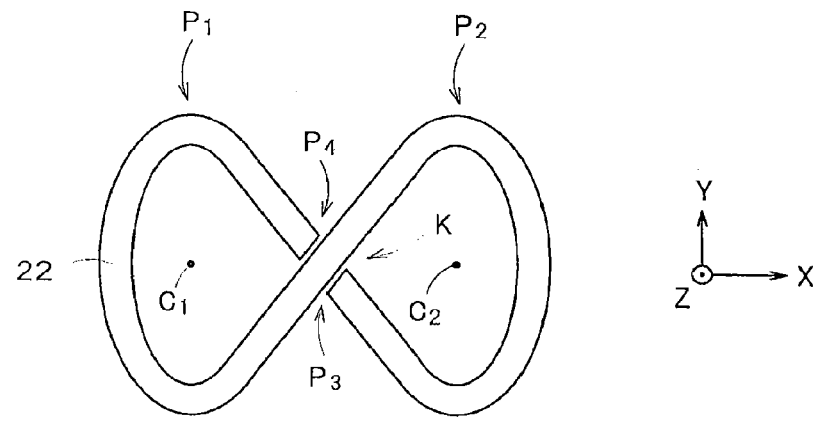
Figure 8C:
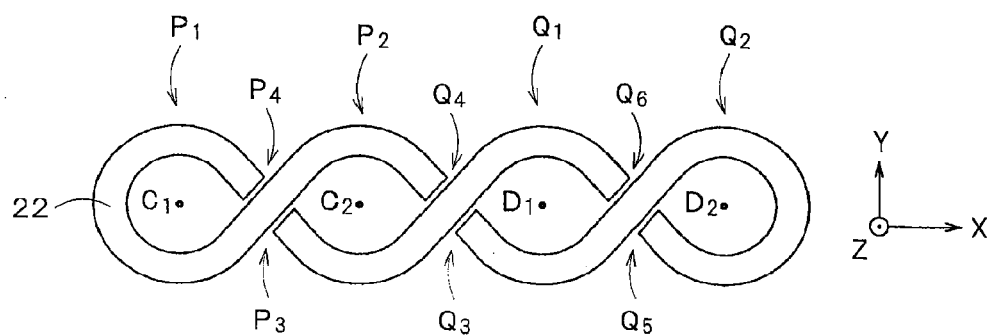

FIGS. 8A to 8C are top views illustrating structures of the belt supporting module 22 of modifications of the first embodiment.

In FIG. 8A, the radius of the first portion $P_1$ is set $R_1$ and the radius of the second portion $P_2$ is set $R_2$ ($>R_1$). In this way, the size of the first portion $P_1$ may be different from the size of the second portion $P_2$. Nevertheless, it is advantageous that these are set to be the same size as in FIG. 1 because the films high in uniformity are easy to be formed.

In FIG. 8B, the shapes of the first and second portions $P_1$ and $P_2$ are oval. In this way, the shapes of the first and second portions $P_1$ and $P_2$ may be other than circles.

In FIG. 8C, the belt supporting module 22 surrounds axes $D_1$ and $D_2$ in addition to the axes $C_1$ and has a shape having two 8-shapes joined together. A portion $Q_2$ has the similar shape to that of the first portion $P_1$. A portion $Q_1$ has the similar shape to that of the second portion $P_2$. Portions $Q_3$ and $Q_5$ have the similar shapes to that of the third portion $P_3$. Portions $Q_4$ and $Q_6$ have the similar shapes to that of the fourth portion $P_4$. In this way, the belt supporting module 22 may have a shape other than an 8-shape as long as the inner circumference and the outer circumference of each wafer 1 can be interchanged.

As described above, the semiconductor manufacturing apparatus of the present embodiment includes the belt supporting module 22 including the first to fourth portions $P_1$ to $P_4$, the belt 21 that rotates around the axis $C_1$ in the first direction and rotates around the axis $C_2$ in the second direction, the wafer supporting modules 23 provided on the belt 21 and the like. Therefore, according to the present embodiment, the inner circumference and the outer circumference of each wafer 1 can be interchanged between the first portion $P_1$ and the second portion $P_2$, which enables the films high in uniformity to be formed on the wafers 1.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a belt supporting module including a first portion that is provided around a first axis, a second portion that is provided around a second axis different from the first axis, a third portion that connects the first portion and the second portion, and a fourth portion that connects the first portion and the second portion and is positioned below the third portion;
   a belt provided on the belt supporting module, configured to rotate around the first axis in a first direction, and configured to rotate around the second axis in a second direction that is reverse to the first direction;
   a wafer supporting module provided on the belt and configured to support a wafer; and
   raw material feeding heads provided above the belt and configured to feed a raw material of a film to be formed on the wafer.

2. The apparatus of claim 1, wherein the wafer supporting module is provided on the belt such that an upper face of the wafer supporting module that moves on the fourth portion is parallel to a lower face of the third portion.

3. The apparatus of claim 2, wherein the wafer supporting module is provided on the belt such that the upper face of the wafer supporting module that moves on the first or second portion inclines relative to the upper face of the wafer supporting module that moves on the fourth portion.

4. The apparatus of claim 1, wherein the wafer supporting module includes a heater configured to heat the wafer.

5. The apparatus of claim 1, wherein the belt supporting module has an 8-shape that surrounds the first axis and the second axis.

6. The apparatus of claim 1, wherein the belt supporting module includes a plurality of rails extending along a movement direction of the belt, and the belt is provided on the plurality of rails.

7. The apparatus of claim 1, wherein the raw material feeding heads include first raw material feeding heads configured to feed a first raw material of the film, and second raw material feeding heads configured to feed a second raw material of the film.

8. The apparatus of claim 7, wherein the film is a compound containing a first element and a second element, the first raw material contains the first element, and the second raw material contains the second element.

9. The apparatus of claim 8, wherein the first raw material is a gas containing the first element, and the second raw material is plasma containing the second element.

10. The apparatus of claim 8, wherein the first raw material forms a layer containing the first element on the wafer, and the second raw material changes the layer into the compound by chemical change.

11. The apparatus of claim 7, wherein the first raw material feeding heads and the second raw material feeding heads are alternately provided along a movement direction of the belt above the belt.

12. The apparatus of claim 7, further comprising purge gas heads provided between the first raw material feeding heads and the second raw material feeding heads and configured to feed a purge gas.

13. A method of manufacturing a semiconductor device, comprising:
   rotating a belt around a first axis in a first direction, the belt being provided with a wafer supporting module configured to support a wafer;
   rotating the belt around a second axis different from the first axis in a second direction that is reverse to the first direction; and
   feeding a raw material of a film to be formed on the wafer from raw material feeding heads that are provided above the belt,
   wherein the belt is provided on a belt supporting module including a first portion that is provided around the first axis, a second portion that is provided around the second axis, a third portion that connects the first portion and the second portion, and a fourth portion that connects the first portion and the second portion and is positioned below the third portion.

14. The method of claim 13, wherein the wafer supporting module is provided on the belt such that an upper face of the wafer supporting module that moves on the fourth portion is parallel to a lower face of the third portion.

15. The method of claim 14, wherein the wafer supporting module is provided on the belt such that the upper face of the wafer supporting module that moves on the first or second portion inclines relative to the upper face of the wafer supporting module that moves on the fourth portion.

16. The method of claim 13, wherein the wafer supporting module includes a heater configured to heat the wafer.

17. The method of claim 13, wherein the belt supporting module has an 8-shape that surrounds the first axis and the second axis.

18. The method of claim 13, wherein the belt supporting module includes a plurality of rails extending along a movement direction of the belt, and the belt is provided on the plurality of rails.

19. The method of claim 13, wherein the raw material feeding heads include first raw material feeding heads configured to feed a first raw material of the film, and second raw material feeding heads configured to feed a second raw material of the film.

20. The method of claim 19, further comprising feeding a purge gas from purge gas heads that are provided between the first raw material feeding heads and the second raw material feeding heads.

* * * * *